United States Patent
Afzali-Ardakani et al.

(10) Patent No.: US 7,037,638 B1
(45) Date of Patent: May 2, 2006

(54) HIGH SENSITIVITY CROSSLINKABLE PHOTORESIST COMPOSITION, BASED ON SOLUBLE, FILM FORMING DENDRIMERIC CALIX[4] ARENE COMPOSITIONS METHOD AND FOR USE THEREOF

(75) Inventors: Ali Afzali-Ardakani, Yorktown Heights, NY (US); Tricia Lynn Breen, Hopewell Junction, NY (US); Jeffrey Donald Gelorme, Plainville, CT (US); David Brian Mitzi, Mahopac, NY (US); Michael Joseph Rooks, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 09/685,414

(22) Filed: Oct. 10, 2000

Related U.S. Application Data
(60) Provisional application No. 60/208,269, filed on May 31, 2000.

(51) Int. Cl.
*G03F 7/40* (2006.01)
*G03F 7/038* (2006.01)

(52) U.S. Cl. .............................. 430/288.1; 430/270.1; 430/318; 430/323

(58) Field of Classification Search .............. 430/270.1, 430/288.1, 318, 323
See application file for complete search history.

(56) References Cited

U.S. PATENT DOCUMENTS 5,824,451 A * 10/1998 Aoai et al. ............... 430/270.1
6,093,517 A * 7/2000 Ito et al. .................. 430/270.1

FOREIGN PATENT DOCUMENTS

| JP | 02-53748 A | * | 2/1990 |
| JP | 2000-264953 A | * | 9/2000 |

OTHER PUBLICATIONS

Onishi et al, 118:49297, Chemical Abstracts, ACS CAPLUS online, English abstract of Japanese laid open application JP 04–155342A2, one page.*

Takeshi et al, 131:293201, Chemical Abstracts, ACS CA online, English abstract of POlym. Mater. Sci. Eng. (1999), vol. 81, pp. 85–86, two pages.*

Nakayama et al, 131:221141 ACS CA online, English abstract of J. Photopolym, Sci. Technol. (1999), 12 (2), pp. 347–352, 2 pages.*

Ueda et al, 127:270392, Chemical Abstracts, ACS CA online, English abstract of Polym. mater. Sci. Engl. (1997), 77, pp. 455–456, one page.*

* cited by examiner

*Primary Examiner*—Cynthia Hamilton
(74) *Attorney, Agent, or Firm*—Thomas A. Beck; Daniel P. Morris

(57) ABSTRACT

A high sensitivity, organic solvent developable, high resolution photoresist composition for use in E-beam lithography is disclosed. The composition of the present invention comprises a high sensitivity, soluble, film forming photoresist composition of dendrimeric calix [4]arene derivatives and processes for forming lithographic patterns with a crosslinker selected from glycoluril derivatives capable of reacting with these dendrimer under acid catalysis, a photoacid generator and an organic solvent. The composition of the present invention is particularly useful for production of negative tone images of high resolution (less than 100 nanometers).

13 Claims, 2 Drawing Sheets

HIGH SENSITIVITY CROSSLINKABLE PHOTORESIST COMPOSITION, BASED ON SOLUBLE, FILM FORMING DENDRIMERIC CALIX[4] ARENE COMPOSITIONS METHOD AND FOR USE THEREOF

This application claims the benefit of Provisional Application Ser. No. 60/208,269, filed May 31, 2000.

FIELD OF INVENTION

The present invention relates to high sensitivity, soluble, film forming photoresist composition of dendrimeric calix [4]arene derivatives and processes for forming lithographic patterns therewith.

BACKGROUND OF INVENTION

There is continuing effort in electronic industry to achieve higher circuit density in electronic devices. To archive higher degree of integration, new and improved lithographic tools and techniques have been developed which in turn demand new photoresists that could enhance the resolution of lithographic patterns. Aqueous base developable photoresists which are formed through crosslinking have been disclosed by Reck et al., SPIE Regional Technical Conference on Photopolymers, Ellenville, N.Y. 63, 1988 and in U.S. Pat. Nos. 5,034,304 and 5,204,225 to Feelyt. Such formulations were characterized by polymers having an aromatic moiety, like polyhydroxy styrene or novolak, which are susceptible to electrophilic aromatic substitution, and a crosslinking agent, which can form a carbonium ion upon treatment with acid and a photoacid generator. U.S. Pat. No. 4,810,601 to Allen et al. is concerned with formation of negative tone resist patterns by crosslinking an aromatic compound with monomeric or polymeric source of carbonium ions. Thus, diacetoxymethyl benzene and trisacetoxymesitylene were used with triphenylsulfonium hexafluoroantimonate to crosslink a poly(hydroxystyrene) matrix.

U.S. Pat. No. 5,296,332 to Sachdev and Japanese patents 2-15270 and 1-293339 to Kokai describe aqueous base developable resist composition comprising of a phenolic resin like poly(hydroxystyrene) or Novolak, a crosskinable agent which can form carbonium ion upon treatment with acid, and a photoacid generator.

Calixarene based, organic developable crosslinkable photoresists compositions which are formed through crosslinking have been disclosed by Pfeiffer et al., Microelectron Eng. 1998 42/42 p 359–362 and Fujita, J. et al., in Japanese Journal of Applied Physics, Part 1., 1997, p. 7769–7772 and in U.S. Pat. No. 5,702,620 to Fujita et al., the use of calix[n]arene derivatives, where n=4–8.

SUMMARY OF THE INVENTION

A broad aspect of this invention is a high sensitivity photoresist compositions for generating sub 100 nm negative tone resist images on a substrate, particularly through the use of E-Beam energy. Another aspect of this invention is the use of a dendrimer composition that has a Calix[4] arene molecule as the core for such photoresist applications. The use of calix[4}arene as the dendrimer core makes the synthesis and isolation of relatively large quantities of this type of molecule practical for large scale manufactureable. The compositions of this photoresist consists of (a) a functionalized calix(n)arene molecule that forms a film, with pendant aliphatic hydroxy groups, (b) an acid catalysable crosslinking agent selected from aminoplast family and more particularly from glycouril derivatives and (c) a radiation degradable acid generator to assist in crosslinking of the film former. The calixarene molecules of the present invention are selected from the Calix[4]arene series, (FIG. 1)

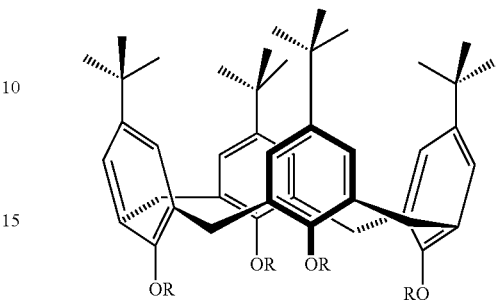

FIG. 1. Representation of 4-tert-Butyl Calix[4]arene core molecule

Calixarene molecules are macrocylic compounds containing four to 8, m-bridged aryl rings of substituted or unsubstituted phenols. Several examples of these materials have been reported to give exceptionally high resolution, negative tone images in e-Beam lithography. It is thought that this result is due to the small dimensions of these highly crystalline molecules. The difficulty in using these types of materials in large scale manufacturing is due to the fact that, since these molecules are crystalline, have high melting points and are practically insoluble in common organic solvents, the 4-tert-butyl calix[4]arenes in particular must be highly derivitized to yield a film forming resist composition. Although several ring derivitizations and sizes (i.e calix[6] and [8] arenes) and unique solvent mixtures have been reported to give film forming resist formulations, these methods are still impractical for general manufacturing. The biggest barriers to production scale use is the low E-beam sensitivities. Similarly, dendrimers—multifunctional compact spheres with the same molecular weight and amount of functional end groups, but smaller size versus the 'random walk' configurations of their linear homologues—have been proposed as resist candidates. A large number of dendrimers reported are based on amide, ester or ether linkages. In contrast to calixarenes, dendrimers are easy to synthesize and soluble in a wide variety of common organic solvents, but have not been reported as E-beam resists. The major disadvantages of these types of dendrimers are their low Tg'sor melting points (<100 deg. C) that would be expected to result in image distortion during post expose thermal processing. We report here a combination approach of using 4-tert-butyl calix[4] arenes as the high melting core molecule for dendrimers to provide for soluble, film forming, small molecular radius, aliphatic ester dendrimer molecules with much higher E-beam sensitivities. These unique materials therefore combine the advantages of both dendrimers and calixarenes because they are easier to synthesize and purify, and are far more sensitive to e-beam radiation.

The crosslinking agents of this composition are selected from Glycouril derivatives shown in the formula:

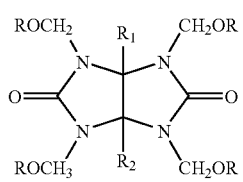

Glycouril derivatives in which R is an alkoxadical, preferably $CH_2OCH_3$ and R1 and R2 can individually be selected from hydrogen, alkyl or aryl groups. The composition of the present invention also includes a radiation degradable acid generator.

The present invention also provides a method of using new resist composition for generating negative tone resist images on a substrate which comprises:

a) coating the substrate with a film comprising of a film forming calixarene selected from glycoluril derivatives and a radiation degradable acid generator;
b) imagewise exposing the film with E-beam radiation to cause crosslinking in the exposed portion of the film;
c) baking the said substrate at elevated temperatures, and
d) developing film in an aqueous base developer.

The present compositions are sensitive to E-beam radiation. The resist speed can be adjusted by adjusting the ratio of the crosslinker to polymer resin.

BRIEF DESCRIPTION OF DRAWINGS

These and other objects, features and advantages of the present invention will become apparent upon a consideration of the following detailed description and the invention when read in conjunction with the drawing Figures, in which.

DETAILED DESCRIPTION OF THE INVENTION

Figure 1:
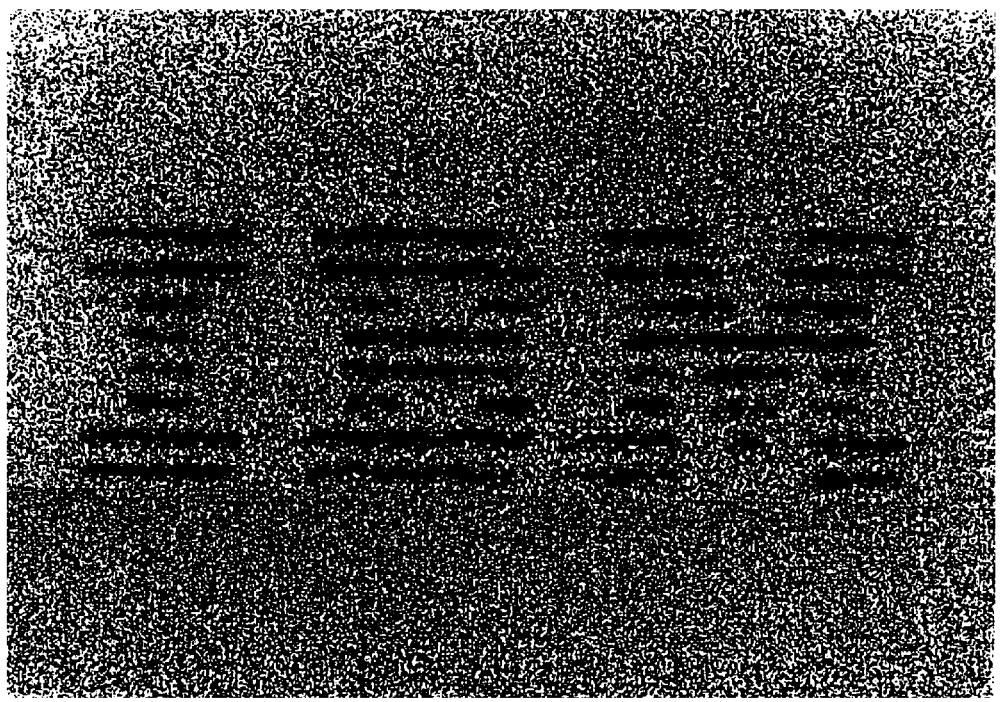
FIGS. 1 and 2 are photomicrographs showing images made using different compositions of the present invention.

The present invention relates to high resolution, organic solvent developable E-beam photoresist compositions for generating negative tone images on a substrate. These compositions comprise (a) a film forming calix[4]arene dendrimer derivative of generation >2 with aliphatic hydroxyls (b) a glycoluril derivative crosslinker which upon acid catalysis can react with the phenolic functionality and form crosslinks, (c) a photodegradable acid generator which upon exposure to UV or E Beam radiation forms the acid catalyst needed for the formation of the crosslinks. The aliphatic hydroxyl containing film forming resin is selected from dendrimers, of 4-t-butyl-calix[4]arene that is disubstituted with dimethyol propionic acid moities shown below:

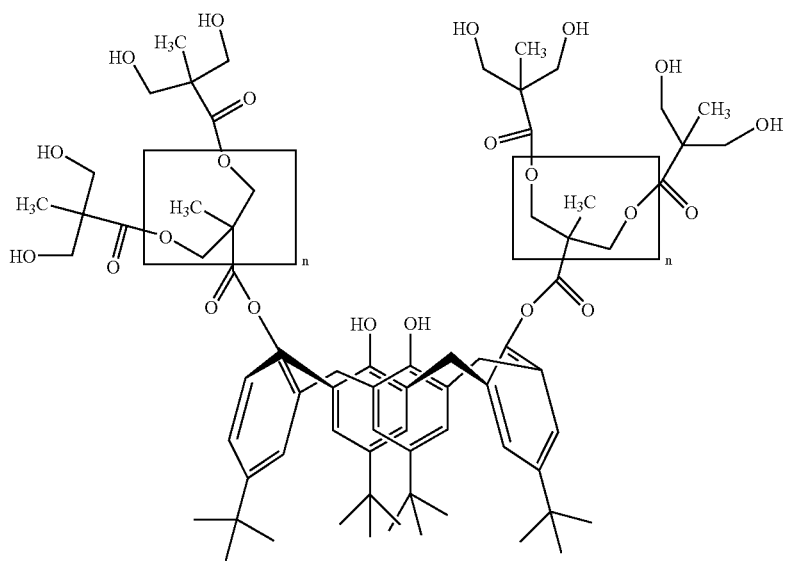

The composition in this invention consist of the above calixarene dendrimer where n is equal to or greater than one. In an embodiment of this invention, this molecule is made from a stepwise dendrimer synthesis from 4-t-butyl calix[4] arene and the acetonide. The concept of Dendrimer synthesis is described in Tomalia et al. in U.S. Pat. No. 4,507,466. The concept of using dimethoyl propionoic acid in dendrimer synthesis is outlined by Hult et al., in Macromolecules, 1995, 28 (5) p 1698–703.

General procedure for the dimethyol propionic acid ester dendrimers using 4-t-butyl calix[4]arene as the core molecule 1. Formation of Dimethyol Propionic Anhydride

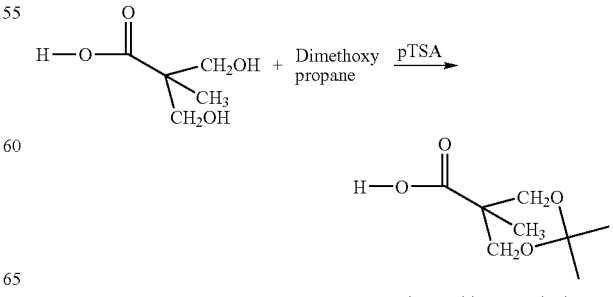

'acetonide protection'

-continued
Dehydration of Acid Acetonide to Anhydride

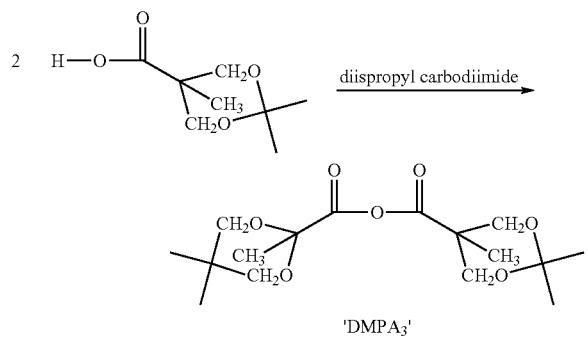

'DMPA3'

2. Functionalization of Calix[4]arene

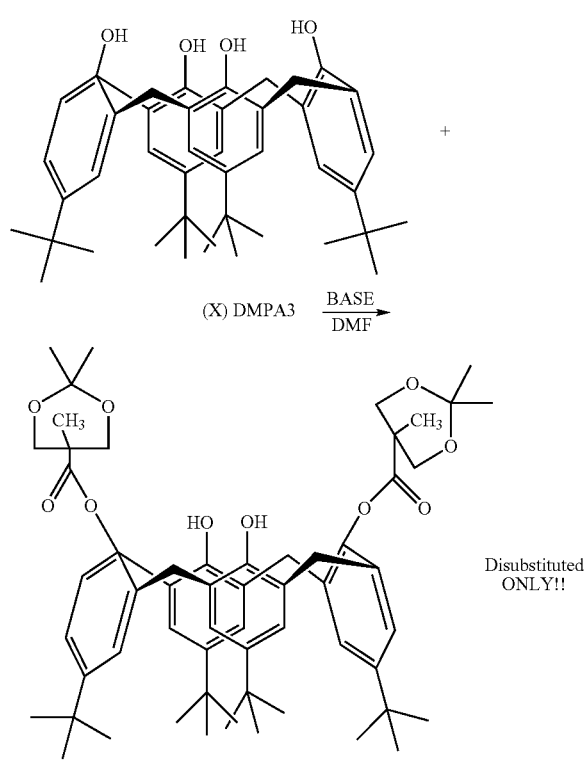

only product (>90%.) no matter what the conditions!!
from slight excess to 100 X stoich excess, from 80 c
to 300 c (neat solution)

3. Acetonide deprotection and generation expansion

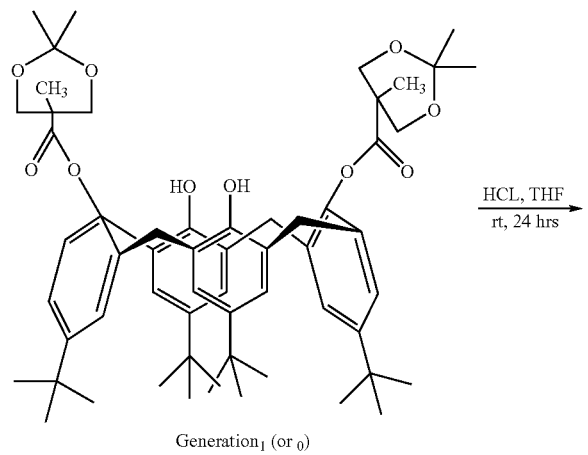

Generation₁ (or ₀)

-continued

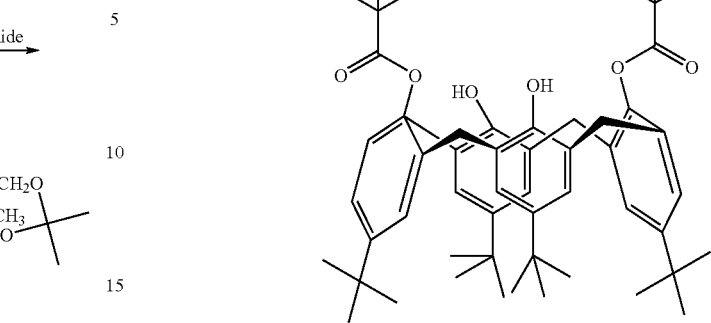

deprotected generation one
deprotected generation + 'DMPA3' ⟶ generation₂, etc

Crosslinkers for the compositions of this invention are Glycoluril derivatives of general formula:

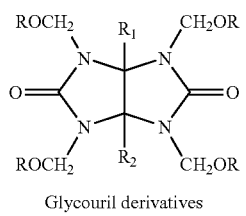

Glycouril derivatives in which R is -CH₃, and $R_1$ and $R_2$ can individually be selected from alkyl groups having 1–6 carbon atoms exemplified by (a) tetrakis-methoxymethyl-3α,6α-diethylglycouril,

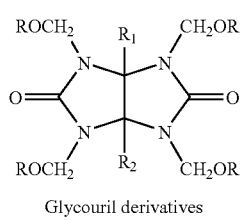

Glycouril derivatives (b) tetrakis-methoxymethyl-3α-methyl-6α-propylglycoluril and
(c) tetrakis-methoxymethyl-3α-methyl-6α-butylglycoluril as shown in the following formula:

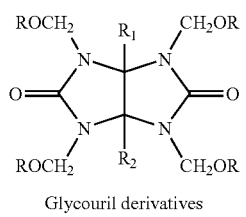

Glycouril derivatives $R^1$ and $R^2$ can also be selected from alkyl and aryl group or hydrogen and aryl groups like (d) tetrakismethoxymethyl-3α-phenylglycouril and (e) tetrakis-methoxymethyl-3α-methyl-6α-phenylglycouril as shown in the following formula:

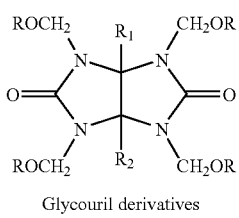

Glycouril derivatives

The composition of the present invention also preferably includes a photoacid generator (PAG) which can be selected from onium salts of Group IV elements as disclosed in U.S. Pat. No. 4,175,972 the teaching of which is incorporated herein by reference and aromatic onium salts of group Va elements disclosed in U.S. Pat. No. 4,069,055 the teaching of which is incorporated herein by reference. Aromatic Group IVa onium salts include those represented by formula:

$[(R)_a \ (R^1)_b \ (R^2)_c \ x] \ d^+[MQe] \ ^{-(e-f)}$ where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure; x is a Group IVa element or metalloid, Q is a halogen radical, a is a whole number from 0 to 3 inclusive, b is a whole number from 0 to 2 inclusive and c is a whole number equal to 0 or 1. Radicals included by R are, for example, ($C_6$ - $C_{14}$) aromatic hydrocarbon radicals such as phenyl, tolyl, xylyl, naphthyl, anthryl and radicals substituted with up to 1 to 4 monovalent radicals, such as C(1–8) alkyl, C(1–8) alkoxy, nitro, chloro, fluoro, and hydroxy; arylacyl radicals such as phenylacetyl; aromatic heterocyclic radicals such as pyridyl and furyl; $R^1$ radicals include C(1–8) alkyl, substituted alkyl such as -$C_2H_4OCH_3$, -$CH_2$-$COCH_3$, etc.; $R^2$ radicals include structures such as:

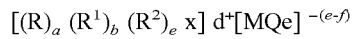

Complex anions included by $MQe^{-(e-f)}$ of above formula are, for example: $BF_4^-$, $PF_6^-$, $SbF_6^-$, $FeCl_4^-$, $SnCl_6^-$, $SbCl_6^-$, $BiCl_6^-$, $AlF_6^{-3}$, $GaCl_4^-$, $InF_4^-$, etc. Group VI a onium salts included by above formula are, for example:

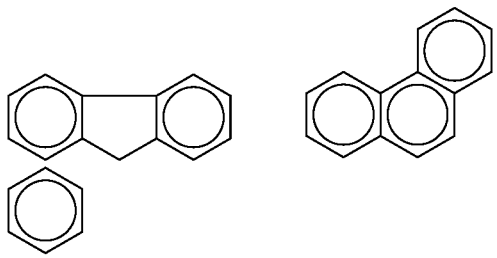

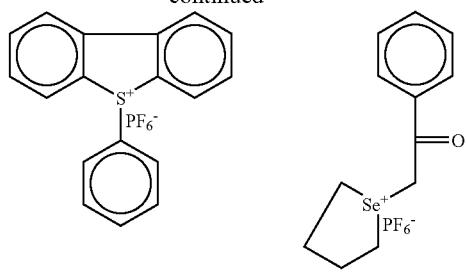

Among non-metallic radiation degradable acid generators suitable for use in compositions of this invention are N-sulfonyloxyimides of the form:

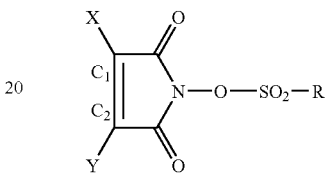

where R is selected from the group consisting of toluene, benzene, $CF_3$, $CF_2CF_3$, $-(CF_2)_n$-Z where n=1 to 4 and Z is H or alkyl or aryl and where X and Y either (1) form polycyclic ring which may or may not contain heteroatoms, or (2) form a fused aromatic ring or (3) may be independently H, alkyl or aryl group and $C_1$ and $C_2$ may form a single or double bond. The compositions of the present invention are preferably carried in a solvent or solvent system. The solvent or solvent system used in carrying these compositions preferably fulfills the need for providing uniform coating with complete coverage of the resist components on the substrate. The solvent preferably evaporates at temperature such that the photoactivity of the resist is not adversely impacted upon a drying step and will not take part in the operation of the photoresist (to be inert toward the phenolic resin and/or crosslinker). Typical of these solvents are propyleneglycol monomethyl ether acetate {PGMEA), ethyl-3-ethoxypropionate {EEP), methoxypropanol, ethoxypropanol, butoxypropanol and ethyl lactate.

For formation of the negative tone image, the composition of the present invention is applied (for example, by spin-coating) on a substrate and the remaining solvent is evaporated by heating the substrate on a hot plate to temperatures of about 70–130° C. for 1–3 minutes. The film is then imagewise exposed to E-beam radiation at 100 kV. 200–370 nm upon which the radiation degradable component of the composition degrades and forms catalytic amount of acid. The crosslinking reaction between aliphatic hydroxyl calixarene dendrimer shown above and crosslinker is then accelerated by heating the substrate from 70–120° C. for preferably one to three minutes. The images are thus rendered less soluble or insoluble in organic solvent. Typical of these solvents are propyleneglycol monomethyl ether acetate (PGMEA), ethyl-3-ethoxypropionate (EEP), methoxypropanol, ethoxypropanol, butoxypropanol, and ethyl lactate, and in the developing stage, the unexposed areas are removed by these solvents.

In another embodiment of this invention, the glycoluril derivatives which are used as crosslinkers are synthesized from corresponding dicarbonyl compounds as described.

Glycoluril derivatives of this invention are highly soluble in the organic solvent of choice, and compared with unsubstituted glycoluril. For purposes of explication of the present

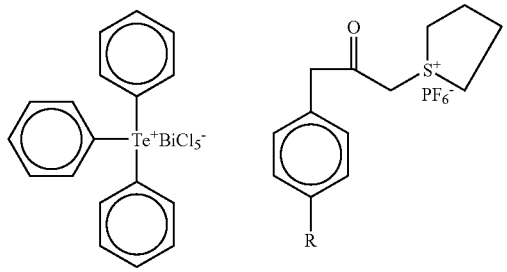

invention, the terms "glycouril" and "glycoluril" connote the identical compound. The expression "organic base" represents a compound having basic (alkaline) proiperties.

General procedure for preparation of alkyl-substituted Glycourils

Synthesis of alkyl-substituted glycolurils is exemplified by the synthesis of 3α-methyl-6α-propylglvcoluril described below.

2,3-hexandione (1.0 mole) and urea (3.0 mole) were added to 2.0 liters of 2% hydrochloric acid and the solution is stirred at room temperature for 24 hours (alternatively, the solution could be refluxed for 2–3 hours). The precipitate is filtered and washed with water and then ethanol and dried. The off-white powder is then crystallized in acetic acid to give analytically pure titer compound in 45% yield.

Hydroxmethylation of Glycolurils

The glycoluril derivative (0.10 mole) is suspended in 37% aqueous formaldehyde solution (0.5 mole) and the pH is adjusted to 10–11 with addition of 10% soiudm hydroxide. The resulting mixture is heated at 50 C for 24 hours after which all the solids are dissolved in the solution. The solution is cooled to room temperature and water is removed under reduced pressure. The residue (either solid or gummy material) is used in the next step without further purification.

Etherification of aminoplast compounds

Tetrakis-hydroxymethyl glycolurils are converted to their corresponding tetramethoxymethyl derivative by suspending in excess of 2,2-dimethoxypropane, few drops of concentrated hydrochloric acid is then added and the mixture is stirred at room temperature for 24 hours. The solvent is removed under reduced pressure and the residue is either crystallized from appropriate solvent ( as in the case of diaryl or alkyl aryl substituted glycolurils) or the oily residue is distilled under high vacuum and high temperature (e.g., in the case of methyl propyl or methyl butyl etc.) to give desired tetrakis-methoxymethyl derivative of glycourils.

The following examples are detailed description of methods of preparation and use of the process of the present invention. The detailed preparations fall within the scope of, and serve to exemplify, the more generally described methods set forth above. The examples are presented for illustrative purposes only, and are not intended to restrict or limit the scope of the invention.

Figure 2:
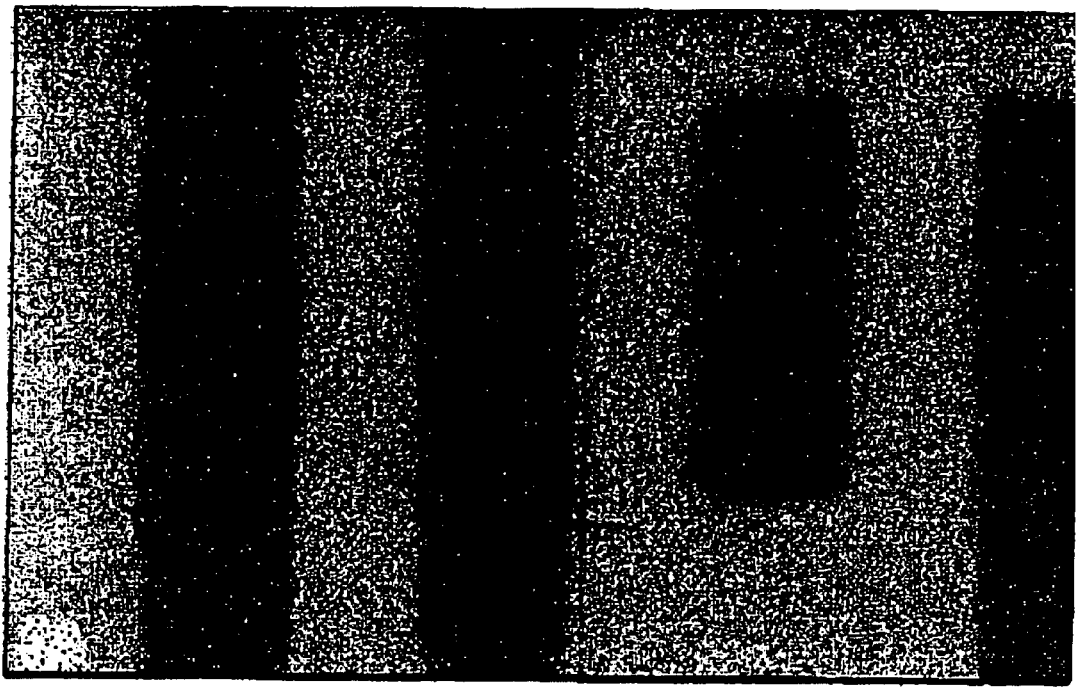

EXAMPLE 1 a) To .001 mole ( each mole has 8 hydroxyl groups) of the 2nd generation dendrimer formed from the reaction of 4-t-butyl calix[4]arene and dimethyl propionic acid, and b) .002 moles of 3a-methyl-6a-propyl-tetrakis-methoxymethylglycoluril (each mole has four reactive methoxy methyol groups) and 10–70% by weight of a and b combined of UVI 6974 which is the commercially available hexafluoroantimin oate salt of a mixture triphenyl sulfonium isomers from Union Carbide Corp., Danbury Conn., are dissolved in the required amount of propyleneglycol monomethyl ether acetate (PGMEA) to make 3% by weight of components a, b and c. The resulting solution is filtered through 0.25 micron filter and spin coated on a substrate. After baking for one minute at 120 C, it is exposed with ca. 40–100 microcoulombs energy from a 100 kV Leica Vectorbeam E-Beam Tool. After a post exposure bake at 120 c for 1 minute, the photoresist is developed in a solution of 100% PGMEA for 1 minute. High resolution images (FIG. 1–4) with sub 100 nm wide lines.

The pattern from the resist structure may then be transferred to the material (e.g., ceramic, metal, organic or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal, organic or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

While this invention has been described in terms of certain embodiment thereof, it is not intended that it be limited to the above description, but rather only to the extent set forth in the following claims. The embodiments of the invention in which an exclusive property or privilege is claimed are defined in the appended claims. The teaching of all references cited herein, are incorporated herein by reference.

What are claimed are:

1. A composition of matter comprising: an admixture of an alphatic hydroxyl containing dendrimer with at least 8 hydroxyl groups per molecule; a glycoluril derivative; a photoacid generator; an organic solvent; and an organic base.

2. A composition according to claim 1 wherein said aliphatic hydroxyl containing dendrimer with at least 8 hydroxyl groups per molecule is a phenolic resin.

3. A composition according to claim 2 wherein said glycoluril derivative has the general formula:

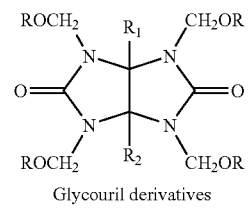

Glycouril derivatives in which R is methyl, $R_1$ and $R_2$ can be selected individually from the group consisting of alkyls having 1–6 carbons, alkenyls, and alkoxys.

4. A composition according to claim 2 wherein said photoacid generator is selected from onium salts of Group IV elements.

5. A composition according to claim 2 wherein said photoacid generator is selected from onium salts of Group VIa elements.

6. A composition according to claim 2 wherein said phenolic resin, said glycoluril derivative, said photoacid generator and said solvent form an admixture comprising from about 40% to about 80% of said phenolic resin from about 5% to about 25% of said glycoluril derivative and from about 2.0% to about 20% of said photoacid generator.

7. A method of forming a patterned material structure on a substrate, said material being selected from the group consisting of semiconductors, ceramics, organics and metals, said method comprising:
   (A) providing a substrate with a layer of said material,
   (B) applying a resist composition to said substrate to form a resist layer over said material layer, said resist composition comprising: an admixture of a aliphatic hydroxyl containing dendrimer with at least 8 hydroxyl groups per molecule; a glycoluril derivative; a photoacid generator; an organic solvent and an organic base;
   (C) patternwise exposing said substrate to radiation whereby acid is generated by said radiation-sensitive acid generator in exposed regions of said resist layer by said radiation,
   (D) contacting said substrate with an aqueous alkaline developer solution, whereby said exposed regions of said resist layer are selectively dissolved by said developer solution to reveal a patterned resist structure, and
   (E) transferring resist structure pattern to said material layer, by etching into said material layer through spaces in said resist structure pattern.

8. The method according to claim 7 wherein said glycoluril derivative has general formula:

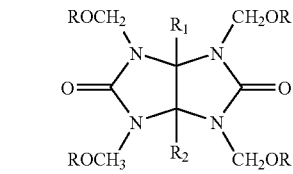

in which $R_1$ and R2 can be selected individually from the group consisting of alkyls having 1–6 carbons, alkenyls, alkoxy.

9. A method according to claim 7 wherein said photoacid generator is selected from onium salts of group IV elements.

10. A method according to claim 7 wherein said photoacid generator is selected from onium salts of Group VIa elements.

11. A method according to claim 7 wherein said photoacid generator is selected from sulfonate of N-hydroxyimides.

12. A method according to claim 7 wherein said photoacid generator is the hexafluoroantimonate of a triaryl sulfonium.

13. A method according to claim 7 wherein said aliphatic hydroxyl containing dendrimer, said glycoluril derivative said photoacid generator and said solvent form an admixture comprising:

from about 90% to about 60% of said dendrimer, from about 5% to about 20% of said glycoluril derivative, and from about 2% to about 20% of said photoacid generator.

* * * * *